(12) United States Patent
Co et al.

(10) Patent No.: US 7,131,040 B2
(45) Date of Patent: *Oct. 31, 2006

(54) MANIFOLD-DISTRIBUTED AIR FLOW OVER REMOVABLE TEST BOARDS IN A MEMORY-MODULE BURN-IN SYSTEM WITH HEAT CHAMBER ISOLATED BY BACKPLANE

(75) Inventors: Ramon S. Co, Trabuco Canyon, CA (US); Tat Leung Lai, Torrance, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 103 days.

This patent is subject to a terminal disclaimer.

(21) Appl. No.: 10/906,318

(22) Filed: Feb. 14, 2005

(65) Prior Publication Data

US 2005/0125712 A1    Jun. 9, 2005

Related U.S. Application Data

(63) Continuation-in-part of application No. 10/249,843, filed on May 12, 2003, now Pat. No. 6,910,162.

(51) Int. Cl.
*G11C 29/00* (2006.01)
(52) U.S. Cl. .................. 714/718; 365/201; 324/760
(58) Field of Classification Search ............... None
See application file for complete search history.

(56) References Cited

U.S. PATENT DOCUMENTS

| | | | | |
|---|---|---|---|---|
| 5,093,982 A | * | 3/1992 | Gussman | 29/705 |
| 5,359,285 A | * | 10/1994 | Hashinaga et al. | 324/158.1 |
| 5,420,521 A | | 5/1995 | Jones | 324/760 |
| 5,574,384 A | | 11/1996 | Oi | 324/760 |
| 5,851,143 A | * | 12/1998 | Hamid | 454/57 |
| 5,903,163 A | * | 5/1999 | Tverdy et al. | 324/760 |
| 6,057,698 A | * | 5/2000 | Heo et al. | 324/765 |
| 6,357,023 B1 | * | 3/2002 | Co et al. | 714/42 |
| 6,367,044 B1 | * | 4/2002 | Komoike | 714/739 |
| 7,070,323 B1 | * | 7/2006 | Wanek et al. | 374/45 |
| 2002/0070745 A1 | | 6/2002 | Johnson et al. | 324/765 |
| 2002/0186031 A1 | * | 12/2002 | Pelissier | 324/760 |
| 2003/0094939 A1 | | 5/2003 | Matsuzawa | 324/158.1 |
| 2003/0112025 A1 | | 6/2003 | Hamilton et al. | 324/760 |
| 2003/0121337 A1 | | 7/2003 | Wanek et al. | 73/865.6 |

(Continued)

*Primary Examiner*—Albert Decady
*Assistant Examiner*—John P. Trimmings
(74) *Attorney, Agent, or Firm*—Stuart T. Auvinen; g Patent LLC (57) ABSTRACT

Hot air blown past memory modules under test in a heat chamber is improved. Hot air entering the chamber from an inlet pipe is split by a manifold and deflectors. Holes in the manifold allow for a relatively even air distribution within the chamber, minimizing temperature variations. Return air is collected by a heat-chamber bottom cover into a return pipe. A heating unit re-heats the return air and blows it into the inlet pipe. One side of the heat chamber is an insulated backplane. Memory modules are inserted into sockets on module motherboards, which are inserted into motherboard sockets on the backplane. On the other side of the backplane, card sockets receive pattern-generator cards outside the heat chamber but electrically connected to the module motherboards through the backplane. The pattern-generator cards exercise the memory modules. The pattern-generator cards are cooled while memory modules in the heat chamber are heated.

21 Claims, 9 Drawing Sheets

U.S. PATENT DOCUMENTS

2004/0008484 A1    1/2004   Konshak et al. ............ 361/687

2005/0179457 A1 *  8/2005   Min et al. ................... 324/760

* cited by examiner

FIG. 9

MANIFOLD-DISTRIBUTED AIR FLOW OVER REMOVABLE TEST BOARDS IN A MEMORY-MODULE BURN-IN SYSTEM WITH HEAT CHAMBER ISOLATED BY BACKPLANE

RELATED APPLICATION

This application is a continuation-in-part of the co-pending application for "Memory-Module Burn-In System with Removable Pattern-Generator Boards Separated from Heat Chamber by Backplane", U.S. Ser. No. 10/249,843, filed May 12, 2003, now U.S. Pat. No. 6,910,162.

FIELD OF THE INVENTION

This invention relates to environmental test systems of memory modules, and more particularly to hot air flow within the test system.

BACKGROUND OF THE INVENTION

Enhanced-reliability components are needed for high-availability and/or critical systems such as web or transaction servers. Additional testing can be performed on components such as board assemblies, semiconductor chips, and memory modules. Often this additional testing is performed at an elevated temperature. Such environmental testing is also known as burn-in.

Weak components often fail earlier at elevated temperatures than at normal temperatures. Poor solder connections on boards or modules can break at higher temperatures, and thermal expansion can loosen poorly seated components. Other manufacturing defects that do not cause immediate failures can create failures that appear after many hours of normal operation at normal temperatures, or after just a few hours at elevated temperatures. Thus elevated-temperature testing can screen for weak components that might later fail in the field, enhancing reliability.

Electronic systems such as servers and personal computers (PCs) use dynamic-random-access memory (DRAM) chips mounted on small, removable memory modules. Older single-inline memory modules (SIMMs) have been replaced with dual-inline memory modules (DIMMs), 184-pin RIMMs (Rambus inline memory modules) and 184-pin DDR (double data rate) DIMMs. New kinds of memory modules continue to be introduced, such as 240-pin DDR2 (double data rate 2) DIMMs.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Burn-in testing can be quite expensive, as each module may have to remain at an elevated temperature in a specialized burn-in tester for many hours or even days. Ideally, the memory module is exercised electronically during the burn-in testing, rather than simply be stored at the high temperature and later tested. Operating the memory module at higher frequencies increases internal heating within the DRAM chips, providing more realistic and thorough testing, increasing reliability.

Exercising the memory modules at higher frequencies is difficult, especially when the modules are within a burn-in oven or heated test chamber. Cables or wires that connect an external test-pattern generator or other test equipment to the memory modules within the oven can be long, severely limiting the frequency of operation.

The parent application disclosed a memory-module burn-in test system that has removable pattern-generator boards. The pattern-generator boards are separated by an insulated backplane from a heat chamber that contains the memory modules under test.

What is desired is improved hot-air flow in such a burn-in test system that tests memory modules at elevated temperatures. An air-flow and heating system is desired for the test system with the removable pattern-generator boards that are insulated from the heat chamber.

BRIEF DESCRIPTION OF THE DRAWINGS

FIGS. 3A–B show back and front sides of the burn-in backplane with pattern-generator cards and module motherboards plugged in.

DETAILED DESCRIPTION

The present invention relates to an improvement in memory-module testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The parent application disclosed a memory-module burn-in test system with removable pattern-generator boards. The pattern-generator boards are separated by an insulated backplane from a heat chamber that contains the memory modules under test.

Figure 1:
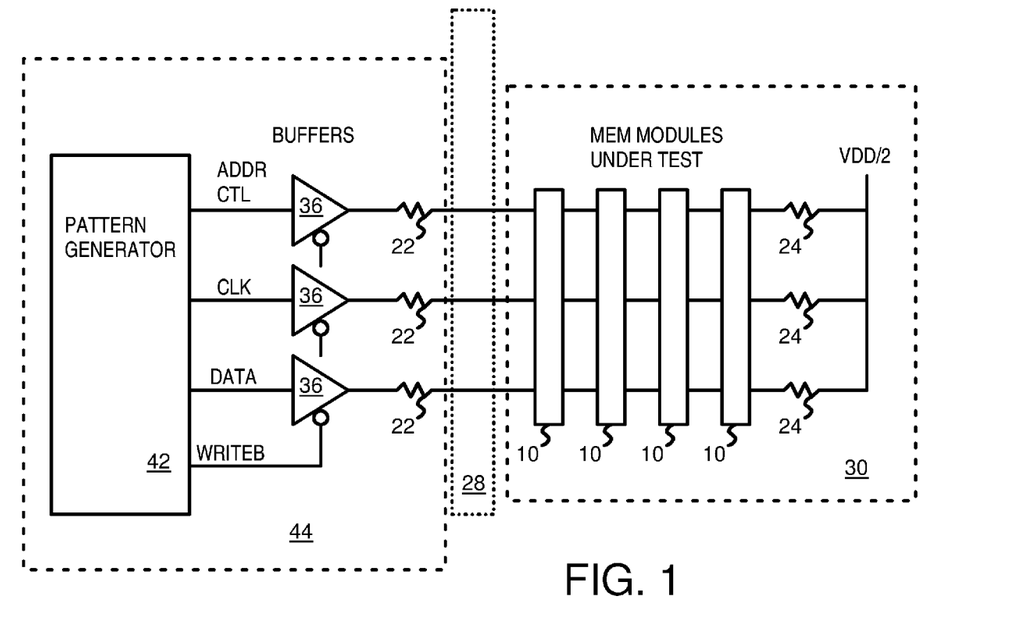
FIG. 1 is an electrical block diagram of a burn-in tester of memory modules.
Figure 3A:
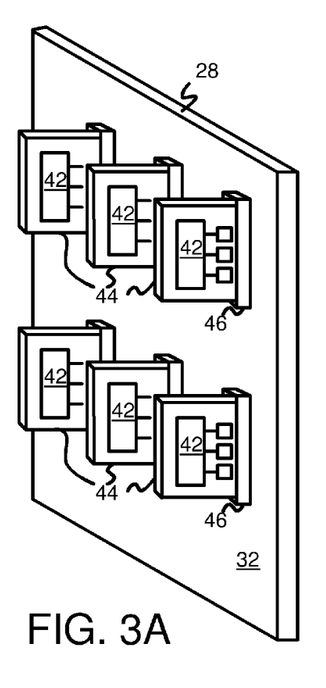
Figure 3B:
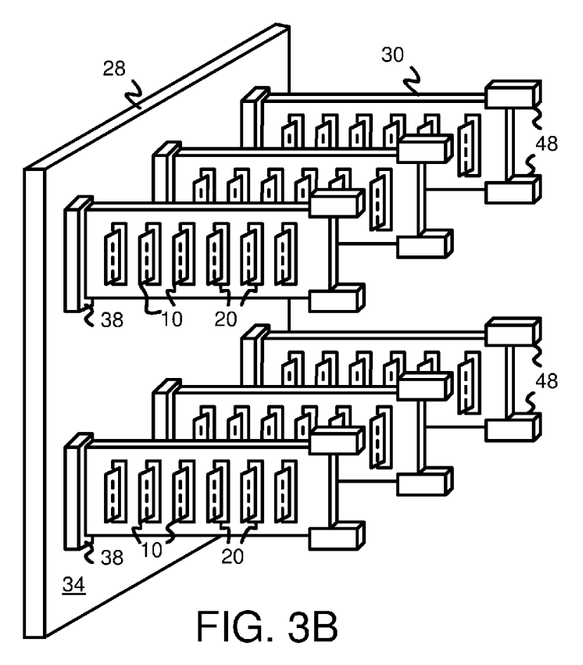
Figure 4:
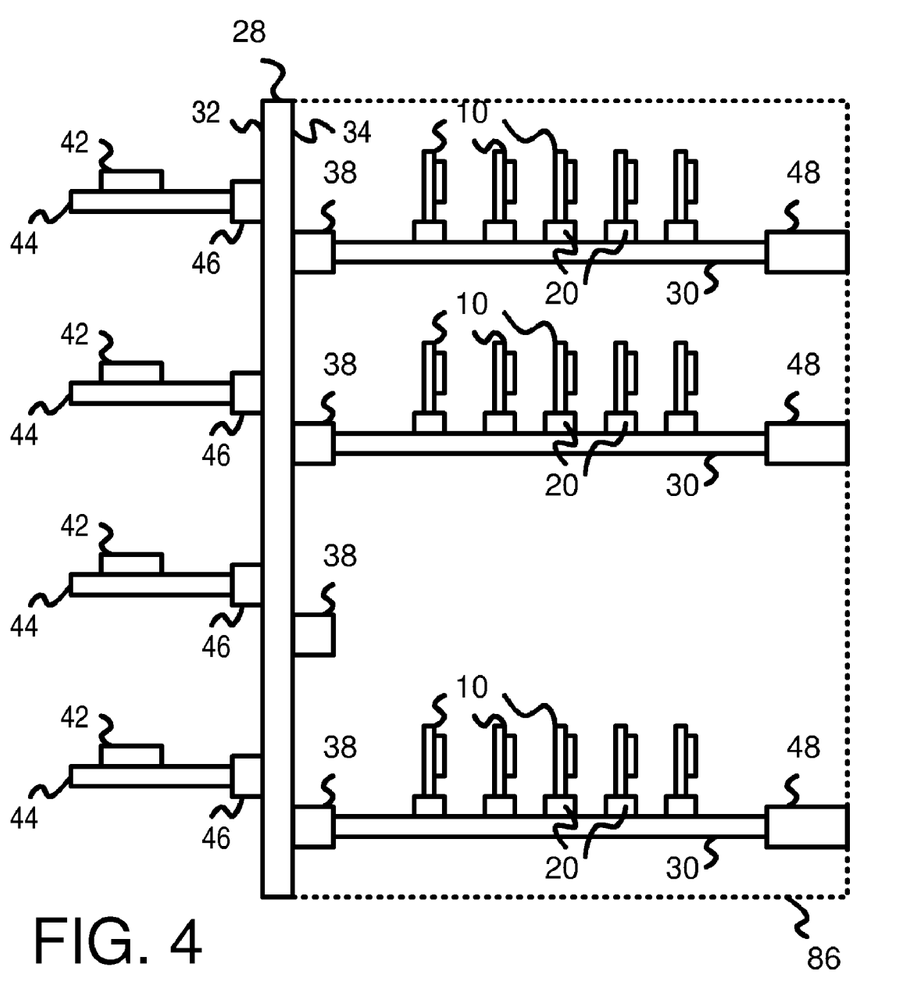
FIG. 4 is an overhead view of a burn-in tester for memory modules.

Heat Chamber Separated from Pattern-Generator Cards FIG. 1–FIGS. 1–4

FIG. 1 is an electrical block diagram of a burn-in tester of memory modules. Backplane 28 separates pattern-generator card 44 from module motherboard 30. A socket (not shown) on the back side of backplane 28 receives an edge of pattern-generator card 44 while a socket (not shown) on the front side of backplane 28 receives an edge of module motherboard 30. Wiring traces and vias on backplane 28 connect signals on the front-side and back-side sockets.

Pattern-generator card 44 contains pattern generator 42, which can be a logic chip containing a pattern-generator circuit. A programmable logic chip such as a field-programmable gate array (FPGA) may be used for pattern generator 42. Pattern generator 42 generates the control, address, and data signals necessary to exercise memory modules 10 inserted into sockets on module motherboard 30. Memory cells on memory modules 10 are addressed in a sequence and written by pattern generator 42. Pattern generator 42 can read back the data from the memory cells. The read data can be compared to expected data by pattern generator 42, or the read data can simply be ignored. Failures can be detected later by external testing once the memory modules are removed from the burn-in tester.

Buffers 36 provide the necessary drive current to drive the large input capacitances of memory modules 10. A write signal from pattern generator 42 can disable some of buffers 36 (such as data buffers) during read operations or can be used to reverse direction.

A clock signal for synchronous DRAMs can also be driven from pattern generator 42 or from a zero-delay buffer 36 such as from a phase-locked loop (PLL). Other specialized clock-driver circuits can be substituted. Buffers 36 may include registers on some signals; the registers can be clocked by the clock signal or by some other signal. Buffers 36 could be located on pattern-generator card 44 or on module motherboard 30.

Termination is provided by resistors 22, 24. These resistors 22, 24 are useful for reduced-voltage-swing DRAMs such as on double-data-rate (DDR) memory modules. The values of resistors 22, 24 can be chosen to reduce the voltage swing to half the normal supply-voltage (Vcc) swing. Expansion is possible by cascading buffers, modules, and terminations.

Figure 2:
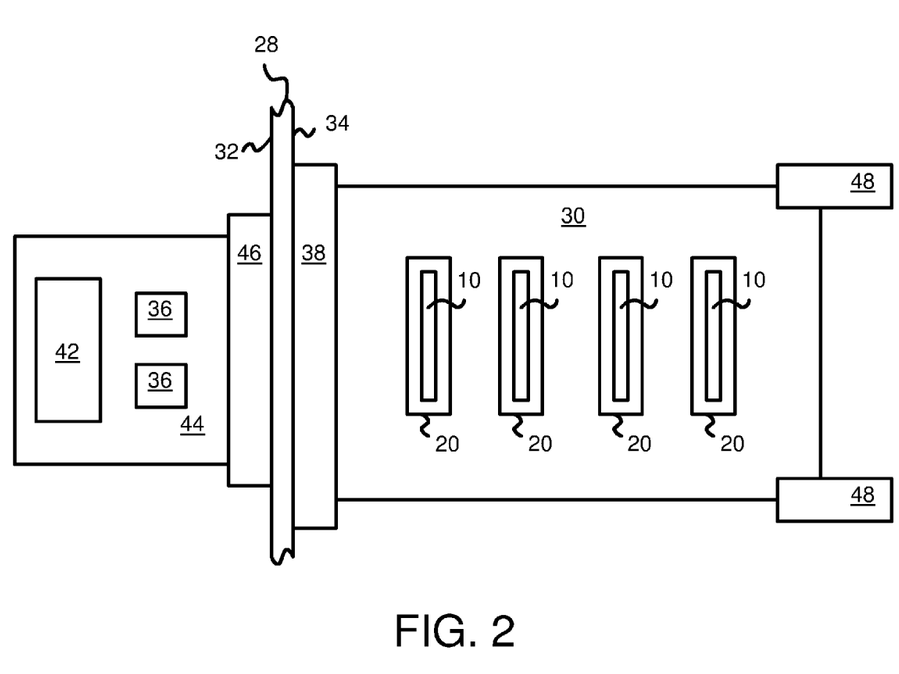
FIG. 2 is a side view of a pattern-generator card and a module motherboard plugged into a portion of the backplane.

FIG. 2 is a side view of a pattern-generator card and a module motherboard plugged into a portion of the backplane. Card socket 46 receives an edge of pattern-generator card 44 that has contact pads to make electrical contact in the socket. Signals such as address, data, and DRAM control are generated by pattern generator 42 and buffered by buffers 36 on pattern-generator card 44.

Card socket 46 is mounted to back-side 32 of backplane 28, while motherboard socket 38 is mounted to front-side 34 of backplane 28. Metalized vias and traces on backplane 28 connect signals in card socket 46 to corresponding signals in motherboard socket 38.

An edge of module motherboard 30 contains contact pads that are inserted into motherboard socket 38. Signals from these contact pads are routed to memory-module sockets 20 by traces on module motherboard 30. Memory modules 10 are inserted into memory-module sockets 20 for burn-in testing. Signals can be routed in parallel to all memory-module sockets 20, while some signals may be applied to just one of memory-module sockets 20, or unique address or socket-select signals can differ among memory-module sockets 20 to allow one of memory modules 10 to be addressed separately from the others. When data is not read back for comparison by pattern generator 42, then identical, parallel signal connections can be used for all memory-module sockets 20.

A technician or operator can remove module motherboard 30 using ejectors 48 to grip module motherboard 30. Once removed, memory modules 10 can be removed for further testing by another (post burn-in) tester and new memory modules 10 inserted into memory-module sockets 20. Module motherboard 30 can then be re-inserted to burn-in test the new modules.

Pattern-generator card 44 can also be removed from card socket 46 by a technician. This allows for defective pattern-generator cards 44 to be removed for repair while another pattern-generator card 44 is inserted. Different types of pattern-generator card 44 can be inserted into card socket 46 for testing different types of memory modules, or for specialized testing.

FIGS. 3A–B show back and front sides of the burn-in backplane with pattern-generator cards and module motherboards plugged in. In FIG. 3A, back-side 32 of backplane 28 has many card sockets 46 in rows and columns. Each card socket 46 can receive a pattern-generator card 44 that contains a pattern generator 42 that generates control signals for one module motherboard 30 plugged into the other side of backplane 28 (FIG. 3B). Wiring traces formed in and on backplane 28 connect electrical signals from one card socket 46 on back-side 32 to one motherboard socket 38 on front-side 34.

In FIG. 3B, front-side 34 of backplane 28 is shown. Rows and columns of motherboard socket 38 are arrayed on front-side 34. Each motherboard socket 38 can receive a module motherboard 30. Memory modules 10 inserted into memory-module sockets 20 are tested by an opposing pattern-generator card 44 on the opposite side of backplane 28. Ejectors 48 are useful for removing and inserting module motherboard 30 into motherboard socket 38 before and after burn-in testing.

FIG. 4 is an overhead view of a burn-in tester for memory modules. Memory modules 10 inserted into memory-module sockets 20 on module motherboards 30 are kept at an elevated temperature by blowing hot air into a heat chamber surrounding module motherboards 30. This heat chamber is enclosed by backplane 28 and by sides 86 and top and bottom dividers (not shown).

Pattern-generator cards 44 are inserted into card sockets 46 on back-side 32 of backplane 28, and can be kept at a cooler temperature than module motherboards 30, since pattern-generator cards 44 are outside of the heat chamber formed by backplane 28 and sides 86. Backplane 28 provides some insulation between the heat chamber and pattern-generator cards 44, allowing pattern generator 42 to be at a lower temperature than memory modules 10.

The front or sides 86 of the heat chamber can be temporarily opened to allow removal of module motherboards 30 from motherboard sockets 38. For example, a hinged cabinet door may be provided on one of sides 86. Windows may also be provided. Ejectors 48 face the front of the heat chamber, allowing a technician to pull module motherboard 30 out of motherboard socket 38 through the open front of the heat chamber.

Figure 5:
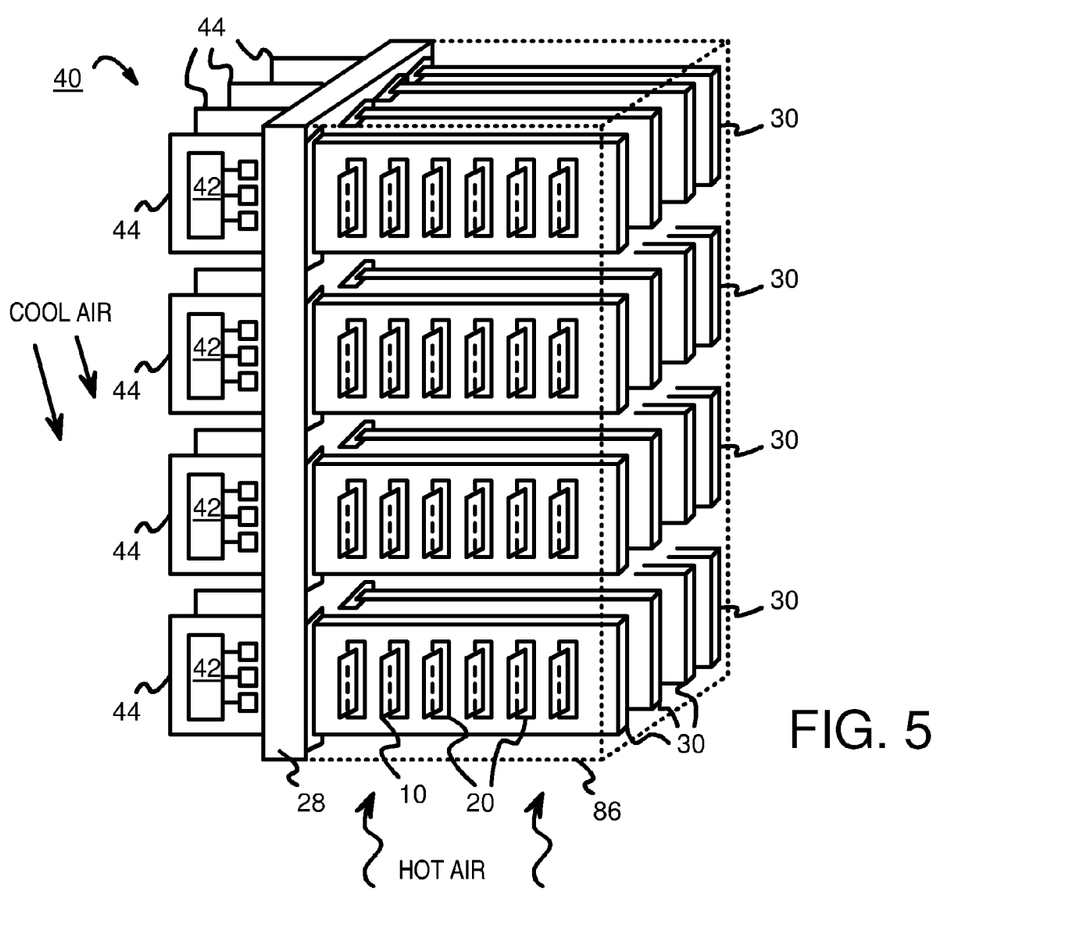
FIG. 5 is a perspective view from the front left of the burn-in tester.

Hot Air Flow in Heat Chamber—FIG. 5

FIG. 5 is a perspective view from the front left of the burn-in tester. Hot air can be blown into the bottom or sides 86 of the heat chamber, rising past module motherboards 30 to raise the temperature of memory modules 10 inserted into memory-module sockets 20.

Backplane 28 not only provides electrical connection from each pattern-generator card 44 to each module motherboard 30, but provides some thermal insulation. A layer of foam insulation may be attached to backplane 28 and to sides 86. Pattern-generator cards 44 are kept cooler than module motherboards 30 because back area 40 is separated from the heat chamber of sides 86 by backplane 28.

Cool air can be blown across pattern-generator cards 44 while hot air is blown through the heat chamber across module motherboards 30. Pattern generators 42 on pattern-generator cards 44 can be kept cooler than memory modules 10, allowing for longer life and better current drive of pattern generator 42.

Backplane 28, pattern-generator cards 44, and module motherboards 30 can be mounted on a rack that is enclosed by sides 86. Several racks can be mounted on top of each other, or beside one another in a larger burn-in unit enclosure. Hot air can be blown in from the bottom or sides of the unit. Local heaters, thermocouples, or other temperature-sensors can also be used to better regulate and control heating. The unit could be turned, rotated, flipped, or otherwise re-oriented. Cooling, humidity, or other environmental testing could also be performed.

Backplane 28 can route power and ground to all pattern-generator cards 44 and all module motherboards 30. Monitoring and control signals can also be routed through backplane 28, such as reset signals to pattern generators 42 or result or status data from pattern generator 42 to a central controller or network interface to a host.

Figure 6:
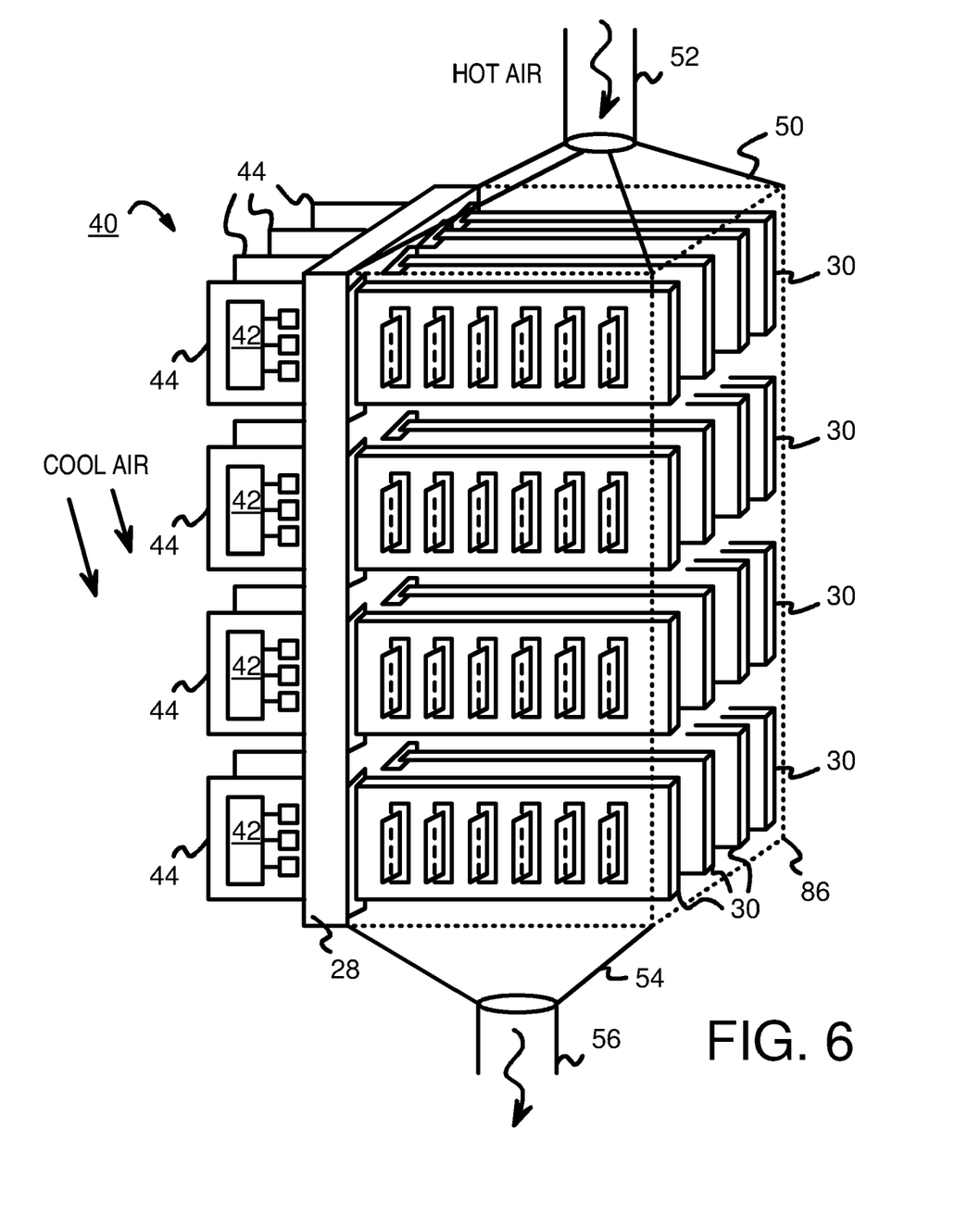
FIG. 6 shows a heat chamber with forced hot-air flow with cooling of removable pattern-generator cards.

Improved Hot-Air Flow—FIGS. 6–6

FIG. 6 shows a heat chamber with forced hot-air flow with cooling of removable pattern-generator cards. Backplane 28 provides electrical connection from each pattern-generator card 44 to each module motherboard 30. An insulated heat chamber around the memory modules under test and module motherboards 30 is formed by layers of foam insulation attached to backplane 28 and to sides 86. Module motherboards 30 can be mounted on racks inside the heat chamber enclosed by sides 86 and backplane 28.

Pattern-generator cards 44 are kept cooler than module motherboards 30 because back area 40 is separated from the heat chamber of sides 86 by insulated backplane 28. Cool air can be blown across pattern-generator cards 44. Pattern generators 42 on pattern-generator cards 44 can be kept cooler than memory modules 10, allowing for longer life and better current drive of pattern generator 42.

Hot air can be blown into the heat chamber from the top through inlet pipe 52, which feeds hot air through heat-chamber top cover 50. While heat-chamber top cover 50 could just be a flat plate, a conical or pyramid shape can better distribute the hot air delivered through inlet pipe 52 over module motherboards 30.

The hot air from inlet pipe 52 is blown downward past edges of module motherboards 30 until the bottom of the heat chamber is reached. Then heat-chamber bottom cover 54 forces the air flow into return pipe 56. Return pipe 56 and inlet pipe 52 can be ducting or piping with various fittings such as angles and bends that recirculate the hot air from return pipe 56 past a heater and fan or other pump and back into inlet pipe 52. While heat-chamber bottom cover 54 could also just be a flat plate, but a conical or pyramid shape can better collect the hot air that has passed over module motherboards 30 into return pipe 56.

Figure 7:
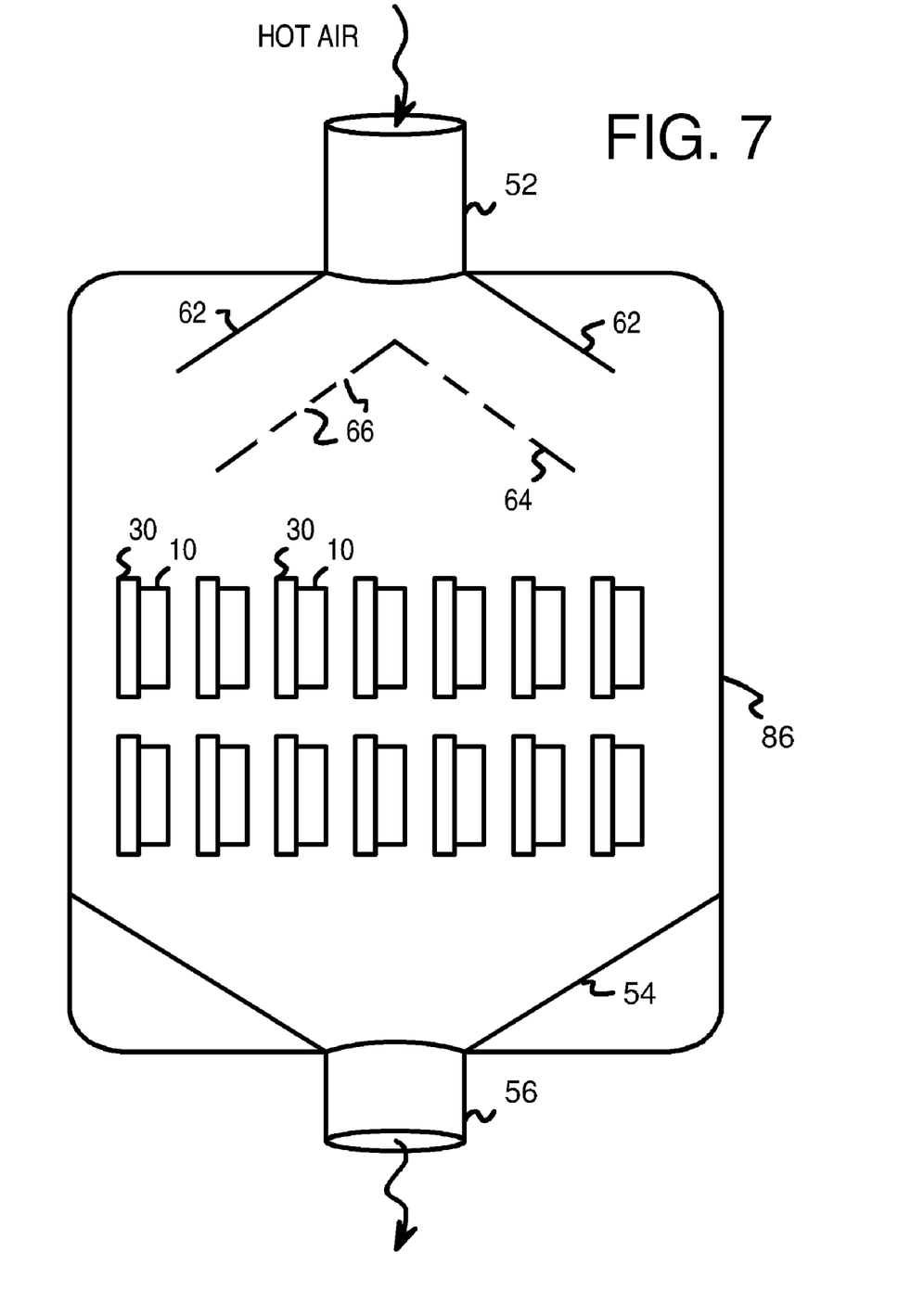
FIG. 7 is a cross section of a heat chamber with a manifold for distributing hot air over memory-module motherboards.

FIG. 7 is a cross section of a heat chamber with a manifold for distributing hot air over memory-module motherboards. Heated air is blown into a heat chamber defined by sides 86 and a backplane through inlet pipe 52. The heat chamber can have a rectangular cabinet shape, but air flow is improved by installation of deflectors 62 and manifold 64 in the chamber.

Hot air entering from inlet pipe 52 is blown over an inverted V-shape top of manifold 64, causing the hot air to be divided into two streams as it passed over the top of manifold 64. Angled deflectors 62 can be attached to the top of the heat chamber and also cause the hot air flow to be deflected downward rather than sideways as the hot air spreads out from inlet pipe 52.

As the hot air flows over the top surface of manifold 64, some of the hot air passes through holes 66 in manifold 64. The size, shape, and arrangement of holes 66 can be varied to allow for more even distribution of hot air over module motherboards 30 and memory modules 10 inside the heat chamber.

Manifold 64 can be less than the width of the heat chamber. This allows hot air to spill over the ends of manifold 64 and start flowing downward over module motherboards 30 near sides 86 of the heat chamber. Module motherboards 30 near the center of the heat chamber can receive hot air that passed through holes 66 in manifold 64. Deflectors 62 can reach the edges of the heat chamber or can also be cut short of the chamber walls as shown.

At the bottom of the heat chamber, after the hot air has passed over module motherboards 30, heat-chamber bottom cover 54 acts as a collector to collect the air flow into the open end of return pipe 56. Heat-chamber bottom cover 54 may have an angled shape as shown, with return pipe 56 at the very bottom of heat-chamber bottom cover 54. Ideally, heat-chamber bottom cover 54 reaches sides 86 so that all air flow is collected into return pipe 56 without dead-air pockets. Alternately, an angled collector could be used that does not reach sides 86 and is less efficient.

Figure 8:
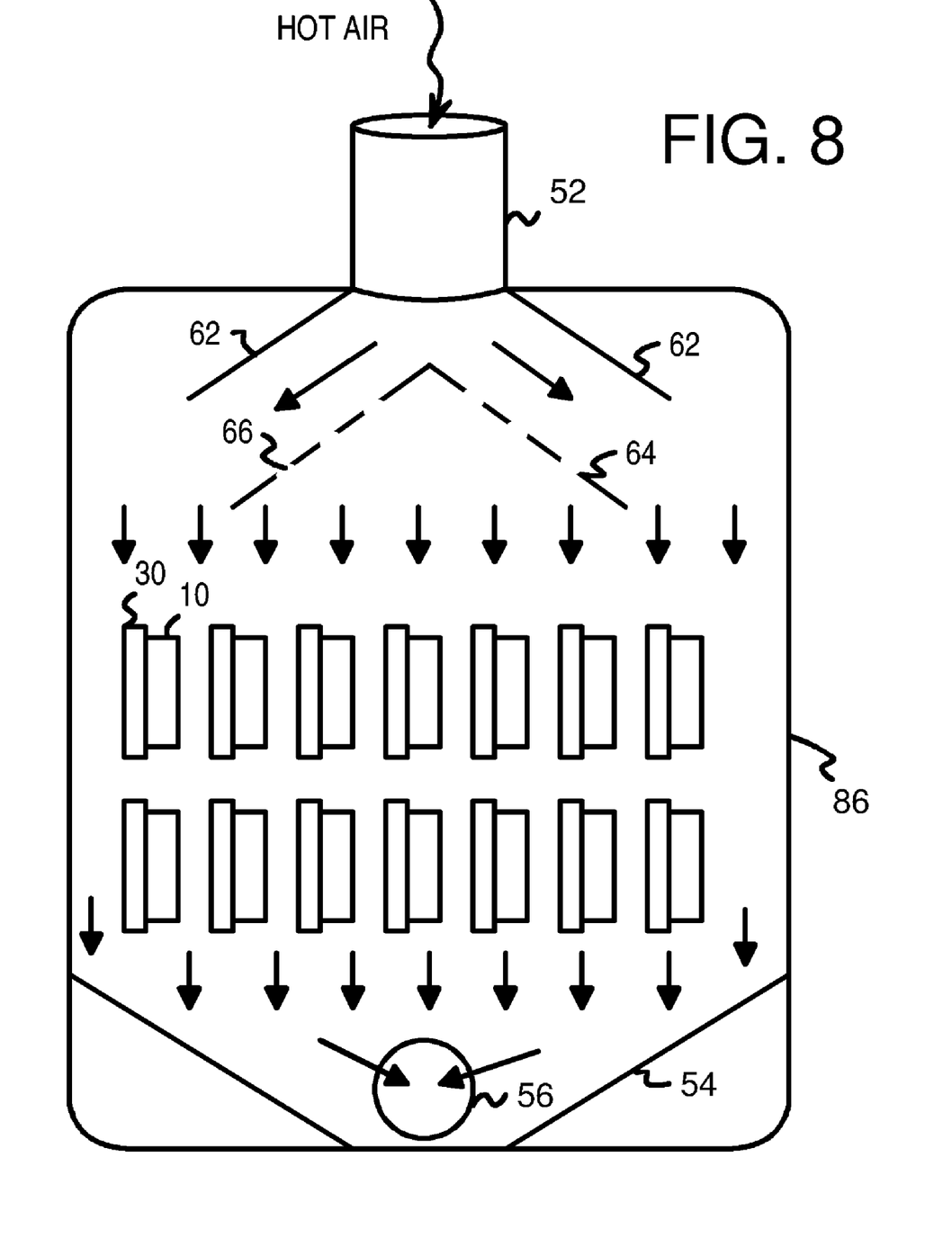
FIG. 8 shows a cross section of a heat chamber with a collector for a side or back outlet pipe.

FIG. 8 shows a cross section of a heat chamber with a collector for a side or back outlet pipe. Heated air is blown into a heat chamber defined by sides 86 and a backplane through inlet pipe 52. Air flow over module motherboards 30 is distributed through holes 66 in manifold 64, and by top deflectors 62. A fairly even air flow over the edges of module motherboards 30 can be obtained, although perfectly distributed air flow is not necessary for good operation, especially when air flow rates are sufficiently high to ensure relatively uniform heating.

Air that has already flown over and heated module motherboards 30 is collected at the bottom of the chamber. A conical or angled shape heat-chamber bottom cover 54 collects the air flow from above and forces it through the open end of return pipe 56.

However, rather than have the open end of return pipe 56 at the very bottom of heat-chamber bottom cover 54, return pipe 56 is connected to the side of the heat chamber. There may be little clearance under the heat chamber for return pipe 56, so in some embodiments it may be desirable to have return pipe 56 connect to the side of the heat chamber rather than the bottom. This may allow for the heat chamber to be a little taller and perhaps hold another row of module motherboards 30.

The open end of return pipe 56 is located near the bottom of heat-chamber bottom cover 54 to collect the air flow. The open end of return pipe 56 can be mounted to backplane 28 or to one of sides 86. In the view shown in FIG. 8, return air flowing downward in the heat chamber is collected and blown into return pipe 56, through the plane of the drawing page and through backplane 28, which forms the back wall of the heat chamber.

Figure 9:
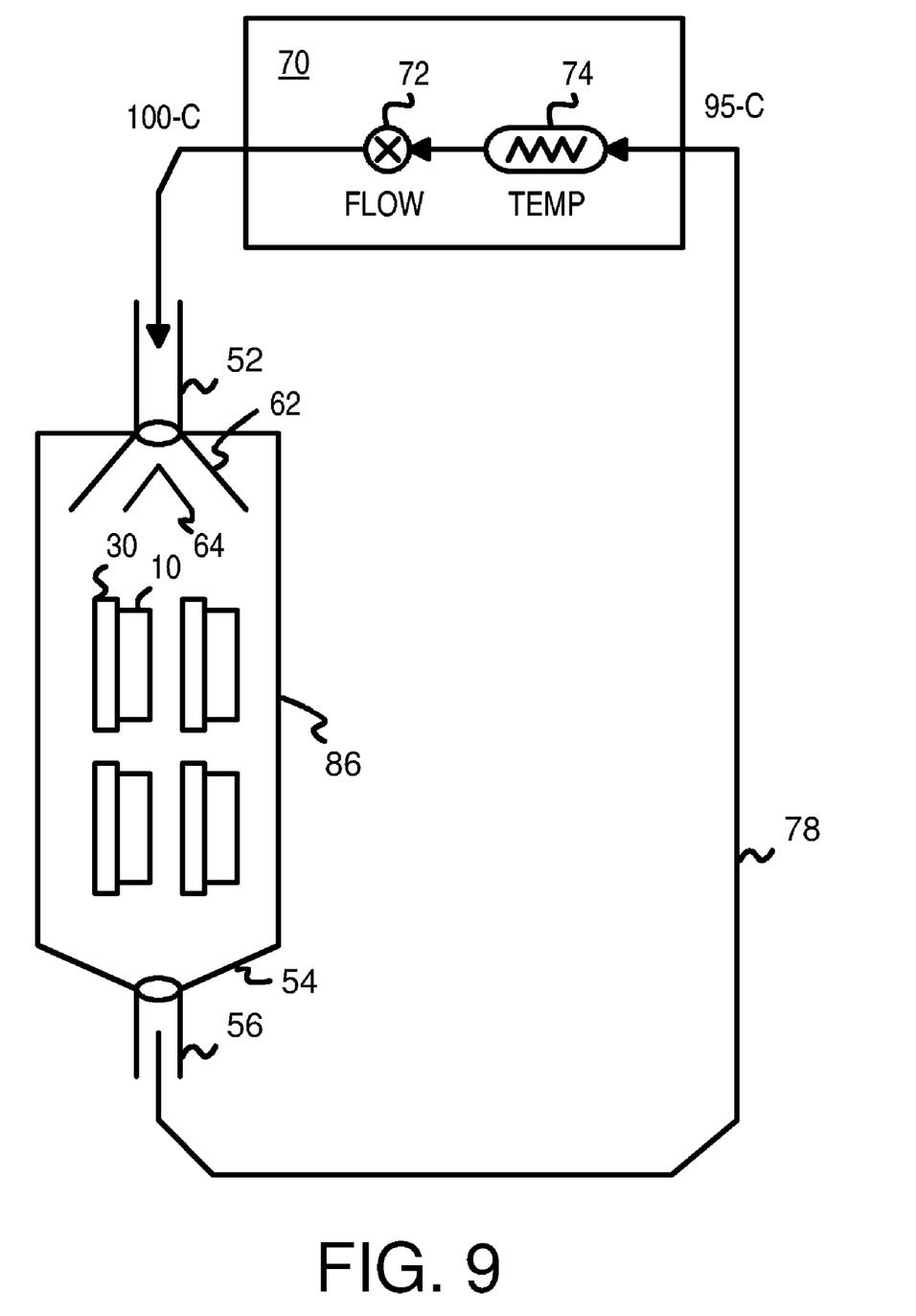
FIG. 9 is a diagram showing hot air circulation through the heat chamber.

FIG. 9 is a diagram showing hot air circulation through the heat chamber. Heated air is blown through inlet pipe 52 into the heat chamber and is distributed by deflectors 62 and manifold 64. The hot air flows over the edges of module motherboards 30 to heat memory modules 10, which are tested by the pattern-generator cards (not shown) hidden behind the backplane, that forms the back of the heat chamber along with sides 86.

The air flow is collected at the bottom of the heat chamber by heat-chamber bottom cover 54 and diverted through return pipe 56. Ducting 78 returns the air from return pipe

56 to heating unit 70. A variety of turns, fittings, pipes and ducts may be used in ducting 78 to return the air. Heating unit 70 can be mounted on the top of a cabinet that includes the heat chamber, or can be mounted separately. Heating unit 70 could also be a larger unit that supplies hot air to several heat chambers and has many distribution pipes.

Return air from return pipe 56 is heated by heater 74 in heating unit 70, and is blown out by blower 72 into inlet pipe 52. The recirculated air can be heated by a small amount, such as from 95 to 100 degrees C. The air flow or its pressure can be regulated by heating unit 70 while the temperature can be regulated using temperature sensors in the air stream or at various places in the heat chamber. A variety of closed-loop flow and temperature control algorithms may be used by heating unit 70 to regulate temperature.

ALTERNATE EMBODIMENTS

Several other embodiments are contemplated by the inventors. Memory modules designated as high reliability can be tested within the burn-in system for various periods of time, or only a sampling of memory modules from production runs can be tested within the burn-in chamber to monitor reliability and detect manufacturing problems. Prototype and engineering testing can also be performed. Other testing of the memory modules can also be performed before or after testing within the burn-in system.

Some embodiments may not have ejectors on cards, or may have other handling or insertion/removal devices. Many variations in shapes and cross sections can be substituted for the manifold, holes, deflectors, heat-chamber bottom and top covers, etc. Multiple pipes and manifolds could be used. Air flow may be streamlined or laminar at low flow rates, but turbulent at higher flow rates. Eddies, flow diversions, dead spots, and other flow inefficiencies may still be present to some extent. Better heat transfer to the memory modules can be ensured by increasing the flow rates, producing a smaller boundary layer near surfaces of the memory modules. Desirable flow rates and heating loads can often be determined empirically.

Rather than blow in heated air from the top, the heated air may enter from other locations such as the sides or bottom. However, the heat generated by the modules themselves may tend to gather at the upper half of the chamber. A strong airflow from the top may help to distribute this heat. It is thus thought that a more even heat distribution can be achieved by blowing the hot air downward rather than upward.

Pattern generator 42 could use a standard DRAM controller activated by a programmable device such as a processor or state machine, or pattern generator 42 could be a state machine or controller. Buffers could be located on pattern-generator card 44 in the cooler environment, or could be located on module motherboard 30 in the hot environment, but closer to the memory modules being driven. Some buffers, registers, or clock drivers could be on pattern-generator card 44 while others are on module motherboard 30 or even on backplane 28. Patterns could be generated to write all locations on large DRAM chips, such as by writing to a million or more addresses.

Rather than have each module motherboard 30 driven by one pattern-generator card 44, a pattern-generator card 44 could drive several module motherboards 30.

The number of test sockets on the motherboards could vary, and additional components could be added to the module motherboards. More than one edge socket could be used for each connection. Different mounting mechanisms and electrical connections could be substituted. The motherboard and pattern-generator card may be substantially perpendicular to the backplane by being at an angle such as from 60 to 120 degrees rather than exactly 90 degrees.

A thicker fiberglass board or other additional insulation that better insulates the pattern-generator cards from the elevated temperatures near module motherboards can also be used.

Many kinds of memory modules can be tested. Modules using standard DRAM or newer EDO and synchronous DRAM can be tested. The system is ideally suited for testing the highest-speed memory modules, since signal trace length and capacitive loading is minimized. Other memories such as RAMBUS modules, DDR modules, and PC133 synchronous modules can be tested.

Various sizes of memory in the memory module, and form factors for memory modules can be used with the invention, limited by the module motherboard 30 and memory-module sockets 20. Different kinds of module motherboards and pattern-generator cards can be substituted.

A Yamaichi type connector could be used as the memory-module sockets, but a production-quality connector/socket with low insertion force may be substituted. A production quality connector/socket can take more insertions (greater than 100,000 times) than conventional sockets on motherboards (rated for 100 insertions). A production socket also has an ejector normally located at the 2 edges of the socket. This alleviates the ejection of modules.

A network controller card on the ISA or PCI bus that communicates with a main system interface or host can be used. A controller card or a standard parallel or serial-port may interface to the main system interface or host. FireWire, USB, or other emerging standards can be used for the interfaces.

Cascading or expansion is possible. Capacitive loading by the memory modules can limit the number of modules that can be placed on a bus for a given operating frequency. In order to use one pattern generator card, another buffer can be placed at the end of the bus for regenerating the test signal. The regenerated test signal is used to drive a subsequent bank of modules and terminations. This is possible when all the test signals are propagating in the same direction, for example, writes to the modules only.

During writes, all memory modules can be selected and written in parallel at the same time. There can be separate module select lines (static, not dynamic) for each module. Writing can happen concurrently on all modules. During read, only one module is selected, and a bus conflict is avoided. The read data can be read back or ignored. The address, data, and most control lines are bussed in parallel; the module select lines are not. The module select lines are DRAM chip selects which are made available as pins on the memory module for the module select function.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A forced-air environmental tester for memory modules comprising:
   a backplane forming one side of an environmental chamber;
   motherboard sockets mounted on a first side of the backplane;
   removable module motherboards for insertion into the motherboard sockets;
   a plurality of memory-module sockets mounted on each of the removable module motherboards, the plurality of memory module sockets for receiving memory modules for environmental testing in the environmental tester;
   card sockets mounted on a second side of the backplane;
   removable pattern-generator cards for insertion into the card sockets;
   a pattern generator on each of the removable pattern-generator cards for generating address, data, and control signals to write data to a plurality of memory locations on memory chips on the memory modules inserted into the memory-module sockets on the removable module motherboards;
   an inlet duct carrying forced air into the environmental chamber;
   an air-flow distributor situated between the inlet duct and the removable module motherboards when inserted into the motherboard sockets;
   a return duct that carries return air from the environmental chamber; and
   an air collector situated between the return duct and the removable module motherboards when inserted into the motherboard sockets,
   whereby memory modules are tested within the environmental chamber by pattern generators on removable pattern-generator cards outside the environmental chamber that are separated by the backplane that forms one side of the environmental chamber.

2. The forced-air environmental tester for memory modules of claim 1 further comprising:
   an air blower, situated outside the environmental chamber and coupled between the return duct and the inlet duct, the air blower generating the forced air into the inlet duct from the return air from the return duct.

3. The forced-air environmental tester for memory modules of claim 2 further comprising:
   a heater for heating the forced air or the return air.

4. The forced-air environmental tester for memory modules of claim 3 wherein the air-flow distributor comprises:
   a manifold that receives and distributes the forced air over the memory modules inserted into the plurality of memory-module sockets mounted on each of the removable module motherboards.

5. The forced-air environmental tester for memory modules of claim 4 wherein the manifold further comprises holes for distributing the forced air to a center of the environmental chamber.

6. The forced-air environmental tester for memory modules of claim 5 further comprising:
   deflectors situated between the manifold and the inlet duct, for deflecting the forced air over the memory modules inserted into the plurality of memory-module sockets mounted on each of the removable module motherboards.

7. The forced-air environmental tester for memory modules of claim 5 wherein the inlet duct and the air-flow distributor are situated near a top of the environmental chamber;
   wherein the air collector and the return duct are situated near a bottom of the environmental chamber.

8. The forced-air environmental tester for memory modules of claim 7 wherein the inlet duct has forced air flow that is substantially parallel to air flow past the memory modules within the environmental chamber.

9. The forced-air environmental tester for memory modules of claim 8 wherein the return duct has forced air flow that is substantially parallel to air flow past the memory modules within the environmental chamber.

10. The forced-air environmental tester for memory modules of claim 8 wherein the return duct has forced air flow that is substantially perpendicular to air flow past the memory modules within the environmental chamber;
    wherein the return duct connects to a side of the environmental chamber.

11. The forced-air environmental tester for memory modules of claim 5 wherein the manifold is angled to air flow past the memory modules within the environmental chamber and is not parallel or perpendicular to the air flow.

12. The forced-air environmental tester for memory modules of claim 11 wherein the manifold has an inverted V-shape in a cross section.

13. The forced-air environmental tester for memory modules of claim 12 wherein an apex of the inverted V-shape of the manifold is situated to receive the forced air from the inlet duct.

14. The forced-air environmental tester for memory modules of claim 5 wherein the air collector is angled to air flow past the memory modules within the environmental chamber and is not parallel or perpendicular to the air flow.

15. The forced-air environmental tester for memory modules of claim 14 wherein the air collector has a partially conical or pyramidal shape.

16. A heated-air-flow memory-module burn-in system comprising:
    a chamber for heating memory modules;
    an inlet pipe for carrying heated air into the chamber;
    a distributor, receiving the heated air from the inlet pipe, for distributing the heated air as air flow within the chamber;
    a return pipe for carrying air flow from the chamber;
    a collector, receiving the air flow within the chamber and collecting the air flow into the return pipe;
    a backplane forming a side of the chamber, for making electrical connections, the backplane having an inner side facing into the chamber and an outer side facing away from the chamber;
    external connector sockets, on the outer side of the backplane;
    internal sockets, on the inner side of the backplane;

wherein external connector sockets are electrically connected to a corresponding inner socket;

pattern-generator cards inserted into the external connector sockets, for generating test patterns to write locations in dynamic-random-access memory (DRAM) chips on the memory modules heated in the chamber; and module motherboards inserted into the internal sockets, containing memory module sockets for receiving the memory modules, each module motherboard being within the chamber and having wiring traces for connecting signals carrying the test patterns from the pattern-generator cards passed through the backplane to the internal socket to the memory modules inserted into the memory module sockets on the module motherboard;

wherein the pattern-generator cards are external to the chamber but the module motherboards are inside the chamber, whereby memory modules are heated in the chamber and tested by the module motherboards using test patterns generated externally by the pattern-generator cards.

17. The heated-air-flow memory-module burn-in system of claim 16 wherein the backplane further comprises a thermally-insulating cover; and wherein the collector has an angled cross-sectional shape wherein a pipe end of the collector attached to the return pipe has a smaller area perpendicular to air flow than does a chamber end of the collector that is closer to the module motherboards.

18. The heated-air-flow memory-module burn-in system of claim 17 wherein the return pipe has an opening to a bottom of the chamber substantially parallel to the air flow through the chamber past the module motherboards or substantially perpendicular to the air flow through the chamber past the module motherboards.

19. The heated-air-flow memory-module burn-in system of claim 17 wherein the distributor comprises:

a manifold that splits the heated air into at least two air flows within the chamber with holes in the manifold to pass air into a center of the chamber.

20. A re-circulating burn-in chamber for testing memory modules comprising:

pattern-generator means for generating test patterns for testing dynamic-random-access memory (DRAM) chips on memory modules;

first socket means for electrically connecting and mechanically supporting an external card external to a heated portion of the re-circulating burn-in chamber;

pattern-generator card means for removably connecting the pattern-generator means to the first socket means;

second socket means for electrically connecting and mechanically supporting an internal card inside the heated portion of the re-circulating burn-in chamber;

module motherboard means for removably connecting to the second socket means;

memory module socket means, on the module motherboard means, for receiving memory modules for testing on the re-circulating burn-in chamber;

insulated backplane means for electrically connecting a first socket means to a second socket means;

heat chamber means for enclosing the module motherboard means, forming the heated portion of the re-circulating burn-in chamber with the insulated backplane means as a wall;

wherein the insulated backplane means is further for thermally insulating the module motherboard means inside the heated portion of the re-circulating burn-in chamber from the pattern-generator card means external to the heated portion of the re-circulating burn-in chamber, manifold means, at a first end of the heat chamber means and receiving heated air from an inlet, for distributing the heated air over the module motherboard means; and collector means at a second end of the heat chamber means, for collecting the heated air after passing over the module motherboard means into a return pipe;

whereby heated air is distributed within the heat chamber means and collected for return.

21. The re-circulating burn-in chamber for testing memory modules of claim 20 further comprising:

return heater means, receiving heated air from the return pipe, for re-heating the heated air from the return pipe to generate the heated air into the inlet pipe.

* * * * *